(12) United States Patent
Shim et al.

(10) Patent No.: US 11,597,837 B2
(45) Date of Patent: Mar. 7, 2023

(54) THERMOSETTING RESIN COMPOSITION FOR SEMICONDUCTOR PACKAGE, PREPREG AND METAL CLAD LAMINATE USING THE SAME

(71) Applicant: LG CHEM, LTD., Seoul (KR)

(72) Inventors: Changbo Shim, Daejeon (KR); Yongseon Hwang, Daejeon (KR); Hwayeon Moon, Daejeon (KR); Hee Yong Shim, Daejeon (KR); Hyunsung Min, Seoul (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 17/052,488

(22) PCT Filed: Jan. 17, 2020

(86) PCT No.: PCT/KR2020/000872
§ 371 (c)(1),
(2) Date: Nov. 2, 2020

(87) PCT Pub. No.: WO2020/162668
PCT Pub. Date: Aug. 13, 2020

(65) Prior Publication Data
US 2021/0171768 A1 Jun. 10, 2021

(30) Foreign Application Priority Data
Feb. 8, 2019 (KR) .................. 10-2019-0015098

(51) Int. Cl.
| | |
|---|---|
| C08K 3/36 | (2006.01) |
| C08L 71/12 | (2006.01) |
| B32B 5/02 | (2006.01) |
| B32B 15/14 | (2006.01) |
| B32B 15/20 | (2006.01) |
| H01L 23/14 | (2006.01) |
| H01L 23/498 | (2006.01) |
| C08K 9/04 | (2006.01) |
| C08J 5/24 | (2006.01) |

(52) U.S. Cl.
CPC ............ *C08L 71/126* (2013.01); *B32B 5/02* (2013.01); *B32B 15/14* (2013.01); *B32B 15/20* (2013.01); *C08J 5/244* (2021.05); *C08K 3/36* (2013.01); *C08K 9/04* (2013.01); *H01L 23/145* (2013.01); *H01L 23/49822* (2013.01); *B32B 2260/021* (2013.01); *B32B 2260/046* (2013.01); *B32B 2262/101* (2013.01); *C08J 2371/12* (2013.01); *C08J 2409/06* (2013.01); *C08J 2483/04* (2013.01); *C08L 2203/16* (2013.01); *C08L 2203/20* (2013.01)

(58) Field of Classification Search
None
See application file for complete search history.

(56) References Cited

U.S. PATENT DOCUMENTS

| | | | |
|---|---|---|---|
| 2008/0300350 A1* | 12/2008 | Ohno | C08F 283/06 524/548 |
| 2009/0178832 A1 | 7/2009 | Amou et al. | |
| 2009/0203279 A1* | 8/2009 | Mori | H05K 1/056 442/232 |
| 2012/0164464 A1* | 6/2012 | Tang | B32B 5/26 523/400 |
| 2014/0087152 A1* | 3/2014 | Nakamura | H05K 3/381 523/456 |
| 2015/0044484 A1* | 2/2015 | Ito | C08L 63/04 523/427 |
| 2015/0313012 A1 | 10/2015 | Chen et al. | |
| 2016/0297967 A1 | 10/2016 | Jung et al. | |
| 2017/0158854 A1* | 6/2017 | Ueno | B32B 5/02 |
| 2018/0258324 A1 | 9/2018 | Tochihira et al. | |
| 2019/0276661 A1 | 9/2019 | Shim et al. | |
| 2020/0231804 A1* | 7/2020 | Shim | C08L 71/12 |
| 2021/0084757 A1* | 3/2021 | Tsuda | H05K 1/09 |
| 2021/0214547 A1* | 7/2021 | Honda | B32B 15/20 |
| 2021/0229407 A1* | 7/2021 | Higashita | B32B 15/20 |

FOREIGN PATENT DOCUMENTS

| | | |
|---|---|---|
| CN | 101314630 A | 12/2008 |
| EP | 3569655 A1 | 11/2019 |
| JP | H07-247415 A | 9/1995 |
| JP | 0824011 B2 | 3/1996 |
| JP | 2004182816 A | 7/2004 |
| JP | 2009-161725 A | 7/2009 |
| JP | 2018131590 A | 8/2010 |
| JP | 5292783 B2 | 9/2013 |
| JP | 2018-131519 A | 8/2018 |
| JP | 2018168347 A | 11/2018 |
| JP | 2020-506982 A | 3/2020 |
| KR | 10-2009-0078750 A | 7/2009 |
| KR | 10-2014-0023980 A | 2/2014 |
| KR | 10-2015-0060452 A | 6/2015 |
| KR | 10-2015-0089063 A | 8/2015 |
| KR | 10-2017-0090479 A | 8/2017 |
| KR | 10-2018-0107709 A | 10/2018 |
| KR | 10-2018-0125344 A | 11/2018 |
| WO | WO-2018212459 A1 * | 11/2018 ............ B32B 15/08 |
| WO | WO-2019012953 A1 * | 1/2019 ............ B32B 15/06 |

\* cited by examiner

*Primary Examiner* — Robert S Loewe
(74) *Attorney, Agent, or Firm* — Dentons US LLP

(57) ABSTRACT

The present disclosure relates to a thermosetting resin composition for a semiconductor package including a modified phenylene ether oligomer or a modified poly(phenylene ether) having ethylenically unsaturated groups at both ends thereof; a thermosetting resin; a predetermined elastic (co) polymer; and an inorganic filler, and a prepreg and a metal clad laminate including the same.

13 Claims, No Drawings

THERMOSETTING RESIN COMPOSITION FOR SEMICONDUCTOR PACKAGE, PREPREG AND METAL CLAD LAMINATE USING THE SAME

The present application is a National Phase entry pursuant to 35 U.S.C. § 371 of International Application No. PCT/KR2020/000872 filed on Jan. 17, 2020, and claims priority to and the benefit of Korean Patent Application No. 10-2019-0015098 filed with the Korean Intellectual Property Office on Feb. 8, 2019, the disclosures of which are incorporated herein by reference in their entity.

FIELD

The present disclosure relates to a thermosetting resin composition for a semiconductor package, a prepreg and a metal clad laminate.

BACKGROUND

Recently, the signal band of an electronic part such as a semiconductor substrate, a printed circuit board, and an epoxy molding compound (EMC) and an information and communication device tends to increase. The transmission loss of electric signals is proportional to dielectric dissipation factor and frequency. Accordingly, a higher frequency increases the transmission loss and brings about attenuation of signals, thereby leading to a reduction in the reliability of signal transmission. Further, the transmission loss is converted into heat, and thus, a problem of heat generation may also be caused. For that reason, there is growing a need for an insulation material having a very low dielectric dissipation factor in a high frequency region.

In addition, as the demand for high integration, high refinement, high performance, and the like in the semiconductor device and PCB fields is currently increased, the condition is gradually changed into a situation in which the integration of semiconductor devices, the high density of printed circuit boards, and the simplicity of wiring interval are simultaneously required. In order to satisfy these characteristics, it is preferred to use a material having a low dielectric constant which allows a transmission rate to be increased and a low dielectric loss characteristics for reducing a transmission loss.

Conventionally, insulating materials have been developed based on polyphenylene ether (PPE) resins, which are thermosetting resins with excellent dielectric properties, but there were problems such as high melt viscosity, difficulty in handling, moldability of prepreg, and low adhesion to metal foil. In addition, a filler such as a porous filler, which is advantageous for low dielectric properties, has been introduced into the polyphenylene ether resin, but the dispersibility of the filler was low, which caused problems in terms of processability and heat resistance, and it was difficult to apply the filler with a high content.

SUMMARY

It is an object of the present disclosure to provide a thermosetting resin composition for a semiconductor package that simultaneously satisfies low dielectric properties and low dielectric loss while exhibiting excellent processability and heat resistance.

It is another object of the present disclosure to provide a prepreg including the thermosetting resin composition for a semiconductor package.

It is a further object of the present disclosure to provide a metal clad laminate including the prepreg.

In one aspect of the present disclosure, there is provided a thermosetting resin composition for a semiconductor package including: a modified phenylene ether oligomer or a modified poly(phenylene ether) having ethylenically unsaturated groups at both ends thereof; a thermosetting resin; one or more elastic (co)polymers selected from the group consisting of a) a butadiene-based rubber having a number average molecular weight of 1,500 to 10,000, b) a styrene-butadiene-based rubber having a number average molecular weight of 1,500 to 10,000 and a styrene content of 10 to 40% by weight, c) a thermoplastic elastomer containing styrene in an amount of 10 to 70% by weight, and d) a cyanate ester containing polybutadiene rubber, polydimethylsiloxane or fluorinated thermoplastic resin in the molecule; and an inorganic filler.

In another aspect of the present disclosure, there is provided a prepreg prepared by impregnating the resin composition for a semiconductor package into a fibrous substrate.

In a further aspect of the present disclosure, there is provided a metal clad laminate including the prepreg; and a metal foil integrated with the prepreg by heating and pressurizing.

DETAILED DESCRIPTION

Hereinafter, a thermosetting resin composition for semiconductor package, a prepreg, and a metal clad laminate using same, according to specific embodiments of the present invention will be described in more detail.

As used herein, the (co)polymer is meant to include both a co-polymer and a homo-polymer.

According to one embodiment of the present disclosure, there can be provided a thermosetting resin composition for a semiconductor package including: a modified phenylene ether oligomer or a modified poly(phenylene ether) having ethylenically unsaturated groups at both ends thereof; a thermosetting resin; one or more elastic (co)polymers selected from the group consisting of a) a butadiene-based rubber having a number average molecular weight of 1,500 to 10,000, b) a styrene-butadiene-based rubber having a number average molecular weight of 1,500 to 10,000 and a styrene content of 10 to 40% by weight, c) a thermoplastic elastomer containing styrene in an amount of 10 to 70% by weight, and d) a cyanate ester containing polybutadiene rubber, polydimethylsiloxane or fluorinated thermoplastic resin in the molecule; and an inorganic filler.

The present inventors have conducted research on a material for a semiconductor package, and have found through experiments that the composition containing the above-mentioned components can simultaneously satisfy low dielectric properties and low dielectric loss while exhibiting excellent processability and heat resistance, thereby completing the present disclosure.

As the thermosetting resin composition for semiconductor package includes a modified phenylene ether oligomer or a modified poly(phenylene ether) having ethylenically unsaturated groups at both ends thereof, it is possible to significantly lower the relative dielectric constant or dielectric loss after curing while ensuring excellent processability and heat resistance.

The modified phenylene ether oligomer or modified poly(phenylene ether) having ethylenically unsaturated groups at both ends thereof is that where both ends of a phenylene ether oligomer or poly(phenylene ether) are functionalized with ethylenically unsaturated groups.

The ethylenically unsaturated group includes an alkenyl groups such as ethenyl group, allyl group, methallyl group, propenyl group, butenyl group, hexenyl group, and octenyl group; cycloalkenyl groups such as cyclopentenyl group and cyclohexenyl group; acryl group, methacryl group; and alkenylaryl groups such as vinylbenzyl group and vinylnaphthyl group.

The two ethylenically unsaturated groups at both ends of the modified phenylene ether oligomer or modified poly(phenylene ether) having ethylenically unsaturated groups at both ends may be the same or different.

The method for preparing the modified phenylene ether oligomer or modified poly(phenylene ether) having ethylenically unsaturated groups at both ends thereof is not particularly limited. For example, vinylbenzyl group-functionalized product can be prepared by dissolving a bifunctional phenylene ether oligomer and vinylbenzene chloride in a solvent, adding a base under heating and stirring to perform a reaction, and then solidifying the resin.

The modified phenylene ether oligomer or modified poly(phenylene ether) having ethylenically unsaturated groups at both ends thereof may have a number average molecular weight (determined in terms of polystyrene by GPC method) of 500 to 3,000 g/mol, or 1,000 to 2,500 g/mol, in order to secure the handling property, excellent dielectric properties, moldability, etc. of the prepreg formed from the thermosetting resin composition for the semiconductor package of the above embodiment. The modified phenylene ether oligomer or modified poly(phenylene ether) having ethylenically unsaturated groups at both ends thereof may have a number average molecular weight of 1,000 to 3,000.

Meanwhile, the thermosetting resin composition for the semiconductor package may include the above-mentioned predetermined elastic (co)polymer, together with the modified phenylene ether oligomer or modified poly(phenylene ether) having ethylenically unsaturated groups at both ends thereof and a thermosetting resin. Thereby, while having a low dielectric constant and a low dielectric dissipation factor, a phenomenon in which cracks occur at the time of manufacturing a prepreg can be prevented, and high copper foil adhesion and laser via-hole processability can be realized.

Specific examples of the elastic (co)polymer include a) a butadiene-based rubber having a number average molecular weight of 1,500 to 10,000; b) a styrene-butadiene-based rubber having a number average molecular weight of 1,500 to 10,000 and a styrene content of 10 to 40% by weight; c) a thermoplastic elastomer having a styrene content of 10 to 70% by weight; and d) a cyanate ester containing polybutadiene-rubber, polydimethylsiloxane or fluorinated thermoplastic resin in a molecule; or mixtures of two or more thereof, or copolymers of two or more thereof.

The styrene-butadiene-based rubber having a number average molecular weight of 1,500 to 10,000 and a styrene content of 10 to 40% by weight may have a glass transition temperature of −100° C. to −20° C.

Examples of the thermoplastic elastomer having a styrene content of 10 to 70% by weight include styrene-butadiene/butylene-styrene block copolymers such as Tuftec P series having a styrene content of 10 to 70% by weight.

The styrene-butadiene/butylene-styrene block copolymer can have a melt flow rate (MFR) of 3.0 to 5.0 as measured at 190° C. and 2.16 kg load according to ISO 1133.

The physical properties of the polybutadiene rubber, polydimethylsiloxane or fluorinated thermoplastic resin, which is included in the cyanate ester containing polybutadiene rubber, polydimethylsiloxane or fluorinated thermoplastic resin in a molecule, are not particularly limited, but for example, each of the compounds may have a weight average molecular weight of 100 to 10,000.

Meanwhile, the thermosetting resin may include at least one resin selected from the group consisting of bismaleimide resin, cyanate ester resin, and bismaleimide-triazine resin.

As the bismaleimide resin, any of those conventionally used for thermosetting resin composition for a semiconductor package may be used without limitation, and the type thereof is not limited. As a preferred example, the bismaleimide resin may be may at least one selected from the group consisting of a diphenylmethane type bismaleimide resin represented by the following Chemical Formula 13, a phenylene bismaleimide resin represented by the following Chemical Formula 14, a bisphenol A diphenyl ether bismaleimide resin represented by the following Chemical formula 15, and a bismaleimide resin composed of an oligomer of diphenylmethane type bismaleimide and phenylmethane type maleimide represented by the following Chemical Formula 16.

[Chemical Formula 13]

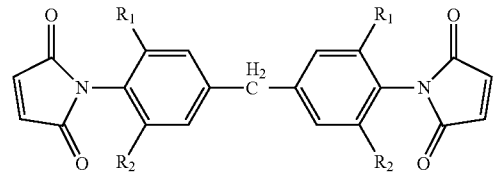

in Chemical Formula 13,
$R_1$ and $R_2$ are each independently H, $CH_3$ or $C_2H_5$.

[Chemical Formula 14]

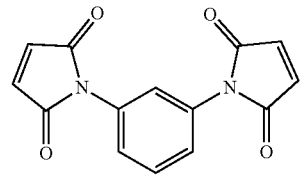

[Chemical Formula 15]

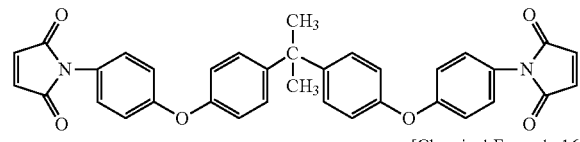

[Chemical Formula 16]

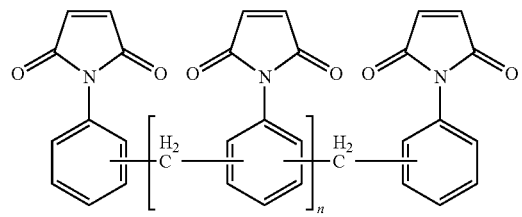

in Chemical Formula 16,
n is an integer of 0 to 50.

In addition, specific examples of the cyanate-based resin may include a cyanate ester resin, and any of those conventionally usually used for the thermosetting resin composition for a semiconductor packages can be used without limitation, and the type thereof is not limited.

As a preferred example, the cyanate ester resin may include novolac type cyanate resin represented by the following Chemical Formula 17, a dicyclopentadiene type cyanate resin represented by the following Chemical Formula 18, a bisphenol type cyanate resin represented by the following Chemical Formula 19 and their partially-triazinated prepolymer. These resins may be used alone or in combination of two or more.

[Chemical Formula 17]

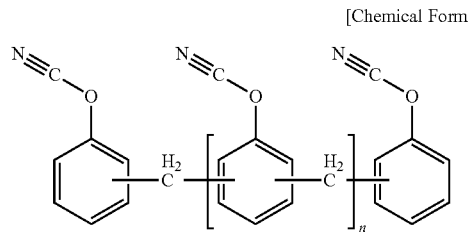

in Chemical Formula 17,
n is an integer of 0 to 50.

[Chemical Formula 18]

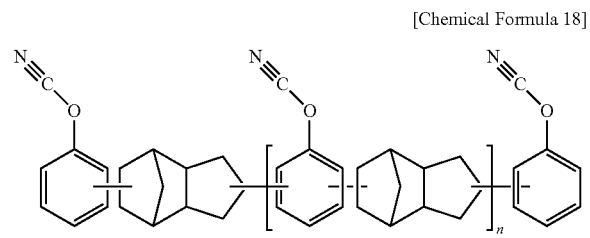

in Chemical Formula 18,
n is an integer of 0 to 50.

[Chemical Formula 19]

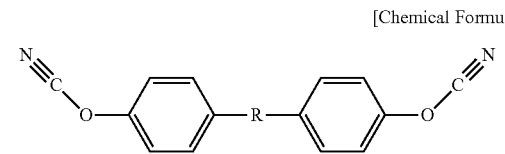

in Chemical Formula 19,
R is

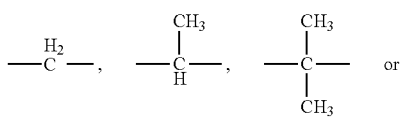

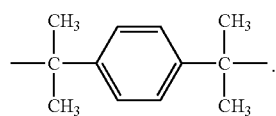

More specifically, depending on the type of R, the cyanate resin of Chemical Formula 19 may be a bisphenol A cyanate resin, a bisphenol E type cyanate resin, a bisphenol F type cyanate resin, or a bisphenol M type cyanate resin, respectively.

And, the bismaleimide resin may include bismaleimide-triazine resin, and the like, and as the bismaleimide-triazine resin, any of those conventionally used for the thermosetting resin compositions for a semiconductor package can be used without limitation, and the type thereof is not limited.

Meanwhile, the thermosetting resin may further include at least one epoxy resin selected from the group consisting of bisphenol A type epoxy resin, phenol novolac epoxy resin, tetraphenyl ethane epoxy resin, naphthalene-based epoxy resin, biphenyl-based epoxy resin, dicyclopentadiene epoxy resin, and a mixture of dicyclopentadiene-based epoxy resin and naphthalene-based epoxy resin.

Specifically, the epoxy resin may be a bisphenol type epoxy resin represented by the following Chemical Formula 5, a novolac type epoxy resin represented by the following Chemical Formula 6, a phenyl aralkyl type epoxy resin represented by the following Chemical Formula 7, a tetraphenyl ethane type epoxy resin represented by the following Chemical Formula 8, a naphthalene type epoxy resin represented by the following Chemical Formulas 9 and 10, a biphenyl type epoxy resin represented by the following Chemical Formula 11, and a dicyclopentadiene type epoxy resin represented by the following Chemical Formula 12.

[Chemical Formula 5]

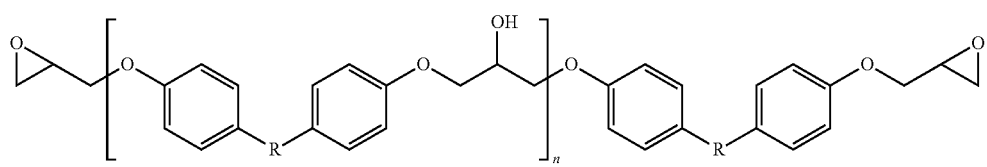

in Chemical Formula 5,
R is

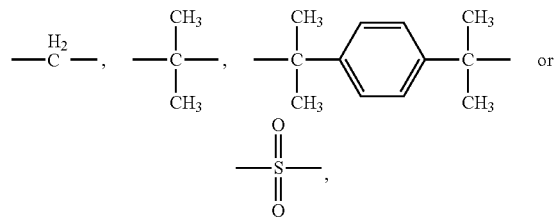 or

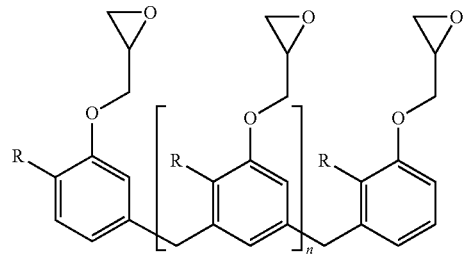

[Chemical Formula 6]

and n is an integer of 0 to 50.

More specifically, depending on the type of R, the epoxy resin of Chemical Formula 5 may be bisphenol A type epoxy resin, bisphenol F type epoxy resin, bisphenol M type epoxy resin, or bisphenol S type epoxy resin, respectively.

in Chemical Formula 6,
R is H or $CH_3$, and
n is an integer of 0 to 50.

More specifically, depending on the type of R, the novolac type epoxy resin of Chemical Formula 6 may be phenol novolac type epoxy resin or cresol novolac type epoxy resin, respectively.

[Chemical Formula 7]

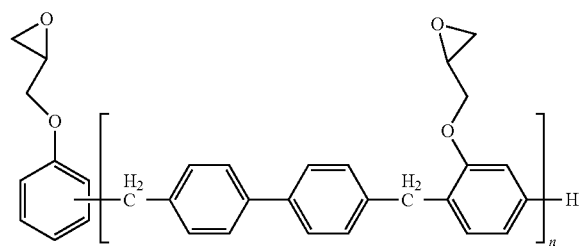

[Chemical Formula 8]

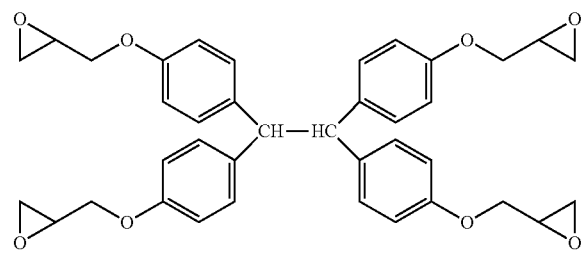

[Chemical Formula 9]

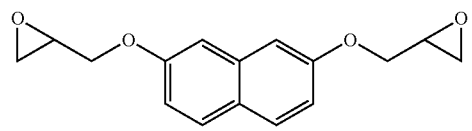

[Chemical Formula 10]

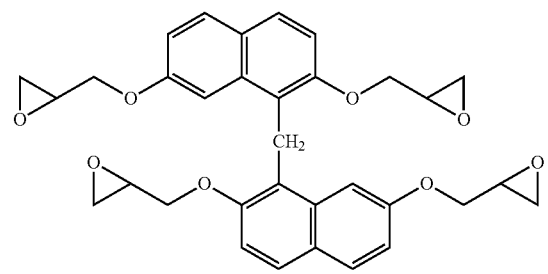

[Chemical Formula 11]

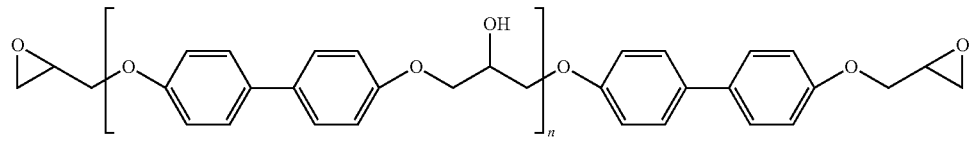

in Chemical Formula 11,
n is an integer of 0 to 50.

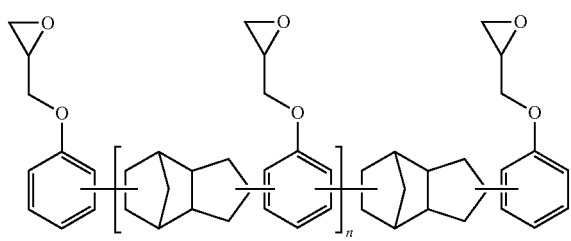

[Chemical Formula 12]

in Chemical Formula 12, n is an integer of 0 to 50.

In addition, the thermosetting resin composition for a semiconductor package of the one embodiment may include an inorganic filler.

As the inorganic filler, any of those conventionally used for the thermosetting resin composition for a semiconductor package can be used without particular limitation, and specific examples thereof may be at least one selected from the group consisting of silica, aluminum trihydroxide, magnesium hydroxide, molybdenum oxide, zinc molybdate, zinc borate, zinc stannate, alumina, clay, kaolin, talc, calcined kaolin, calcined talc, mica, short glass fiber, glass fine powder, and hollow glass.

The thermosetting resin composition for a semiconductor package may include 30 parts by weight to 200 parts by weight of the inorganic filler, based on 100 parts by weight in total of the modified phenylene ether oligomer or modified poly(phenylene ether) having ethylenically unsaturated groups at both ends thereof, the thermosetting resin and the elastic (co)polymer. If the content of the inorganic filler is too small, the coefficient of thermal expansion increases, which may cause problems, for example, a warpage phenomenon intensifies during a reflow process or an EMC (Epoxy Molding Compound) molding process, or due to an increase in the moisture absorption rate, the reliability of the semiconductor package decreases and the rigidity of the printed circuit board decreases.

As the inorganic filler, silica surface-treated with a silane coupling agent can be used from the viewpoint of improving moisture resistance and dispersibility.

As a method of surface-treating the inorganic filler, a method of treating silica particles by a dry or wet method using a silane coupling agent as a surface treatment agent may be used. For example, the silica may be surface-treated by a wet method using 0.01 to 1 part by weight of a silane coupling agent, based on 100 parts by weight of silica particles, and used.

Specifically, the silane coupling agent may include an aminosilane coupling agent such as 3-aminopropyltriethoxysilane, N-phenyl-3-aminopropyltrimethoxysilane and N-2-(aminoethyl)-3-aminopropyltrimethoxysilane, an epoxy silane coupling agent such as 3-glycidoxypropyltrimethoxysilane, a vinyl silane coupling agent such as 3-methacryloxypropyl trimethoxysilane and vinyl trimethoxysilane, a cationic silane coupling agent such as N-2-(N-vinylbenzylaminoethyl)-3-aminopropyltrimethoxysilane hydrochloride, and a phenyl silane coupling agent. The silane coupling agent may be used alone, or, if necessary, in combination of at least two silane coupling agents.

The content and the like of the components contained in the thermosetting resin composition for a semiconductor package may be selected in consideration of physical properties and characteristics of the finally manufactured product.

For example, the thermosetting resin composition for a semiconductor package may include 5 to 70 parts by weight of the modified phenylene ether oligomer or modified poly(phenylene ether) having ethylenically unsaturated groups at both ends thereof, 10 to 50 parts by weight of a thermosetting resin, and 5 to 70 parts by weight of an elastic (co)polymer based on 100 parts by weight in total of the modified phenylene ether oligomer or modified poly(phenylene ether) having ethylenically unsaturated groups at both ends thereof, the thermosetting resin and the elastic (co)polymer.

Meanwhile, the resin composition for a semiconductor package may further include a thermoplastic resin. The thermoplastic resin has an effect of increasing toughness after the prepreg is cured, and may play a role of lowering a coefficient of thermal expansion and an elastic modulus to relax warpage of the semiconductor package. Specific examples of the thermoplastic resin include a (meth)acrylate-based polymer.

Examples of the (meth)acrylate-based polymer are not particularly limited, and for example, it may be an acrylic acid ester copolymer containing a repeating unit derived from a (meth)acrylate monomer and a repeating unit derived from (meth)acrylonitrile; or an acrylic ester copolymer containing a repeating unit derived from butadiene. For example, the (meth)acrylate-based polymer may be a copolymer copolymerized by using monomers such as butyl acrylate, ethyl acrylate, acrylonitrile, methyl methacrylate, glycidyl methacrylate, etc., respectively, within a range of 1 to 40% by weight (relative to the total weight of the entire monomers).

The (meth)acrylate-based polymer may have a weight average molecular weight of 500,000 to 1,000,000. If the weight average molecular weight of the (meth)acrylate-based polymer is too small, after curing, the effects of increasing the toughness of the prepreg and of decreasing the coefficient of thermal expansion and the elastic modulus are deteriorated, which is technically disadvantageous. In addition, if the weight average molecular weight of the (meth)acrylate-based polymer is too large, the fluidity of the prepreg can be reduced.

For the thermoplastic resin, the content used can be determined in consideration of the use and characteristics of the final product. For example, the thermosetting resin composition for a semiconductor package may include 10 to 200 parts by weight of the thermoplastic resin based on 100 parts by weight of the thermosetting resin.

The resin composition for a semiconductor package may further include an alkoxysilane oligomer. The alkoxysilane oligomer allows a prepreg formed using the resin composition for a semiconductor package to exhibit excellent adhesion to a metal foil.

In general, when manufacturing a metal clad laminate or a prepreg, a monomer type coupling agent is added to improve adhesion to the metal foil. However, when a large amount of the monomer type coupling agent is added to achieve the above-mentioned object, it may cause problems, such as delamination of the metal foil and prepreg, decrease in heat resistance, and increase in dielectric constant, due to the low boiling point of the coupling agent.

The alkoxysilane oligomer is an oligomer having an alkoxysilane skeleton, and even when added in a large amount, it is possible to provide a prepreg having excellent adhesion to a metal foil while suppressing a decrease in heat resistance and an increase in dielectric constant.

Preferably, the alkoxysilane oligomer may be an oligomer including a repeating unit represented by the following Chemical Formula 1:

[Chemical Formula 1]

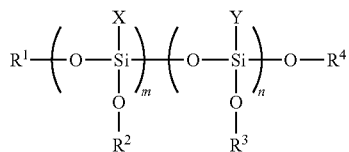

in Chemical Formula 1,

X and Y are each independently alkenyl, methacryl, acryl, phenyl, methyl, or epoxy, $R^1$ to $R^4$ are each independently methyl or ethyl, and m and n are each independently an integer of greater than 1.

Specifically, the alkoxysilane oligomer may be at least one compound selected from the group consisting of methoxy-functional vinyl siloxane oligomer, ethoxy-functional vinyl siloxane oligomer, and methoxy-functional vinyl/phenyl oligomer.

The alkoxysilane oligomer may be included in an amount of 5 to 30 parts by weight, based on 100 parts by weight in total of the modified phenylene ether oligomer or modified poly(phenylene ether) having ethylenically unsaturated groups at both ends, the thermosetting resin and the elastic (co)polymer. In order to sufficiently exhibit the above-described effects, the content of the alkoxysilane oligomer is preferably 5 parts by weight or more. However, when the alkoxysilane oligomer is added in an excessive amount, it may cause problems in which the relative dielectric constant and the dielectric dissipation factor increase, and thus, it is preferable to include in an amount of 30 parts by weight or less.

The resin composition for a semiconductor package may further include a quinone compound. The quinone compound can be added.

Examples of the quinone compound include 1,4-naphthoquinone, 1,4-benzoquinone and the like.

Further, the thermosetting resin composition for for a semiconductor package according to one embodiment can be used as a solution by addition of a solvent, if necessary.

The type of the solvent is not particularly limited as long as it exhibits good solubility in the resin component. For example, an alcohol type, an ether type, a ketone type, an amide type, an aromatic hydrocarbon type, an ester type, a nitrile type and the like can be used, and these solvents may be used alone or in combination of two or more. Further, the content of the solvent is not particularly limited as long as it can impregnate the glass fiber with a resin composition during production of prepreg.

In addition, the thermosetting resin composition for a semiconductor package may further include various other polymer compounds such as other thermosetting resins, thermoplastic resins and oligomers and elastomers thereof, and other flame retardant compounds or additives, as long as it does not impair characteristics inherent to the thermosetting resin composition. These compounds are not particularly limited as long as they are selected from those commonly used in the art. Examples of the additives include ultraviolet absorbers, antioxidants, photopolymerization initiators, fluorescent brighteners, photosensitizers, pigments, dyes, thickeners, lubricants, antifoaming agents, dispersants, leveling agents, brighteners and the like, and these may be used by being mixed to meet the purpose.

Meanwhile, according to another embodiment of the present disclosure, there can be provided a prepreg including a thermosetting resin composition for a semiconductor package and an organic or inorganic fiber.

The prepreg means that the thermosetting resin composition for a semiconductor package is impregnated into a fabrours substrate in a semi-cured state.

The type of the organic or inorganic fiber is not particularly limited, but a glass fiber substrate, a synthetic fiber substrate made of a woven or nonwoven fabric having, as a main ingredient, a polyamide-based resin fiber, such as a polyamide resin fiber, an aromatic polyamide resin fiber, or the like, a polyester-based resin fiber such as a polyester resin fiber, an aromatic polyester resin fiber, or a wholly aromatic polyester resin fiber, a polyimide resin fiber, a polybenzoxazole fiber, a fluororesin fiber, or the like, and a paper substrate having, as a main ingredient, craft paper, cotton linter paper, or mixed paper of linter and craft pulp may be used. Preferably, the glass fiber substrate is used.

The glass fiber substrate may improve strength of the prepreg and decrease water absorption and a coefficient of thermal expansion of the prepreg.

The glass substrate may be selected from glass substrates used as materials for various printed circuit boards. Examples thereof may include glass fabric such as E glass, D glass, S glass, T glass, NE glass, L glass, and Q glass, but is not limited thereto. The glass fiber may be selected according to a desired purpose or performance, if necessary. A form of the glass fiber is typically woven fabric, nonwoven fabric, roving, a chopped strand mat, or a surfacing mat. A thickness of the glass fiber substrate is not particularly limited, but a glass fiber substrate having a thickness of about 0.01 to 0.3 mm, or the like may be used. Among the above materials, a glass fiber material may be more preferable in view of strength and a water absorption property.

Further, a preparation method of the prepreg is not particularly limited, and the prepreg may be prepared by a method well known in the art. For example, as the preparation method of a prepreg, an impregnation method, a coating method using various coaters, a spraying method, or the like, may be used.

In the case of the impregnation method, the prepreg may be prepared by a process of preparing a varnish and then impregnating the fibrous substrate with the varnish.

That is, the preparation conditions of the prepreg are not particularly limited, but it is preferable that the thermosetting resin composition for a semiconductor package is used in a varnish state by addition of a solvent. The solvent for the resin varnish is not particularly limited as long as it is miscible with the resin components and have excellent solubility. Specific examples thereof may include ketones such as acetone, methyl ethyl ketone, methyl isobutyl ketone, and cyclohexanone, aromatic hydrocarbons such as benzene, toluene, and xylene, amides such as dimethyl formamide and dimethylacetamide, aliphatic alcohols such as methyl cellosolve, butyl cellosolve, and the like.

In addition, it is preferable to volatize at least 80 wt % of the used solvent at the time of preparing the prepreg. Owing to this, there are no limitations in the preparation method or drying conditions, or the like. At the time of drying, a temperature may be about 80° C. to 200° C., and a time is not particularly limited due to a balance with a gelation time of the varnish. In addition, an impregnation amount of the varnish is preferably set so that a resin solid content of the varnish becomes about 30 to 80 wt % based on the total amount of a resin solid component of the varnish and the substrate.

According to yet another embodiment of the present disclosure, there can be provided a metal clad laminate including the above-mentioned prepreg having a sheet shape; and a metal foil formed on at least one side of the prepreg.

The metal foil includes a copper foil; an aluminum foil; a composite foil with a three-layer structure having nickel, nickel-phosphorus, nickel-tin alloy, nickel-iron alloy, lead or lead-tin alloy as the interlayer between copper layers having different thickness on either side, or a composite foil with a two-layer structure including aluminum and copper foils.

According to a preferred embodiment, the metal foil used herein is the copper foil or aluminum foil having a thickness of about 2 to 200 μm, and preferably about 2 to 35 μm. Preferably, the metal foil is the copper foil. Further, the metal foil is the composite foil with a three-layer structure having nickel, nickel-phosphorus, nickel-tin alloy, nickel-iron alloy, lead or lead-tin alloy as the interlayer between a 0.5 to 15 μm copper layer and a 10 to 300 μm copper layer on either side. Alternatively, the composite foil has a two-layer structure including aluminum and copper foils.

One or more of the prepreg-including metal clad laminate thus prepared are laminated, and then used for manufacturing a double-sided or multilayer printed circuit board. The double-sided or multilayer printed circuit board can be manufactured by processing a circuit on the metal clad laminate, and the circuit may be processed by a method performed in a manufacturing process of a general double-sided or multilayer printed circuit board.

Meanwhile, according to another embodiment of the present disclosure, there can be provided a metal clad laminate including: a first layer containing a thermosetting resin composition for a semiconductor package of the above one embodiment or a cured product thereof and an organic or inorganic fiber having a thickness of 15 μm to 90 μm; a second layer formed on both surfaces of the first layer, and containing the thermosetting resin composition for a semiconductor package of the one embodiment or a cured product thereof and an organic or inorganic fiber having a thickness of 10 μm to 30 μm; and a metal thin film formed on an outer surface of each of the second layers.

As described above, by including the first layer and the second layer each containing the thermosetting resin composition for a semiconductor package of the one embodiment, the metal clad laminate can simultaneously satisfy low dielectric properties and low dielectric loss while exhibiting excellent processablility and heat resistance.

In addition, by including the thermosetting resin composition for a semiconductor package of the one embodiment, the second layer may have higher adhesion to the metal thin film. Specifically, the peel strength between the second layer and the metal thin film measured by the test method of IPC-TM-650 2.4.8 may be 0.50 kgf/cm or more.

The thickness and the like of the first layer and the second layer may be determined according to the end use and characteristics of the metal clad laminate. More specifically, the thickness ratio of the second layer to the first layer may be 0.2 to 0.7.

According to the present disclosure, the thermosetting resin composition for a semiconductor package that simultaneously satisfies low dielectric properties and low dielectric loss while exhibiting excellent processability and heat resistance, a prepreg provided by using the thermosetting resin composition for the semiconductor package, and a metal clad laminate including the prepreg can be provided.

EXAMPLES

Hereinafter, the present disclosure will be described in more detail by way of Examples. However, these Examples are given for illustrative purposes only, and the scope of the present disclosure is not intended to be limited to or by these Examples.

<Example and Comparative Example: Thermosetting Resin Composition for Semiconductor Package, Prepreg and Metal Clad Laminate>

(1) Preparation of Thermosetting Resin Composition for Semiconductor Package

According to compositions of Table 1 below, each component was added to and mixed with cyclohexanone to conform to a solid content of 50%, and then stirred at room temperature at a speed of 400 rpm for 1 day to prepare each resin composition (resin varnish) for a semiconductor package of Examples and Comparative Examples.

(2) Preparation of Prepreg A-1

The prepared resin composition (resin varnish) for a semiconductor package was impregnated into a glass fiber having a thickness of 15 μm (manufactured by Nittobo, NE-glass #1017), and then dried with hot air at a temperature of 130° C. for 2-5 minutes to produce a prepreg A-1 having a thickness of 30 μm.

(3) Preparation of Prepreg B-1

The prepared resin composition (resin varnish) for a semiconductor package was impregnated into a glass fiber having a thickness of 30 μm (manufactured by Nittobo, NE-glass #1067), and then dried with hot air at a temperature of 170° C. for 2-5 minutes to produce a prepreg B-1 having a thickness of 40 μm.

(4) Manufacture of Metal Clad Laminate A-2 (for Measuring Relative Dielectric Constant and Dielectric Dissipation Factor)

Two of the produced prepregs A were laminated, and then MT18Ex copper foils (copper foil thickness of 2 μm/carrier thickness of 18 um, manufactured by Mitsui) were placed and laminated on both sides thereof. The laminate was cured under the conditions of 220° C. and 35 kg/cm$^2$ for 120 minutes to manufacture a copper clad laminate having an insulation layer thickness of 60 μm.

(5) Manufacture of Metal Clad Laminate B-2 (for Measuring Relative Dielectric Constant and Dielectric Dissipation Factor)

Two of the produced prepregs B were laminated, and then MT18Ex copper foils (copper foil thickness of 2 μm/carrier thickness of 18 um, manufactured by Mitsui) were placed and laminated on both sides thereof. The laminate was cured under the conditions of 220° C. and 35 kg/cm$^2$ for 120 minutes to manufacture a copper clad laminate having an insulation layer thickness of 80 μm.

(6) Manufacture of Metal Clad Laminate B-3 (for Measuring the Peel Strength of Copper Foil)

Two of the produced prepregs B were laminated, and then 3EC-M3-VLP copper foils (copper foil thickness of 12 μm, manufactured by Mitsui) were placed and laminated on both sides thereof. The laminate was cured under the conditions of 220° C. and 35 kg/cm$^2$ for 120 minutes to manufacture a copper clad laminate having an insulation layer thickness of 80 μm.

(7) Manufacture of Metal Clad Laminate A/B/A (for Measuring Adhesive Strength for Copper Foil)

The copper foils on both sides of the copper clad laminate B-2 manufactured in (5) were etched and removed, and then prepreg A-1 was placed and laminated on both sides thereof. 3EC-M3-VLP copper foil (copper foil thickness 12 μm, manufactured by Mitsui) were placed and laminated on both sides thereof, and then the laminate was cured under the conditions of 220° C. and 35 kg/cm² for 120 minutes to manufacture a copper clad laminate A/B/A.

(8) Manufacture of Metal Clad Laminate A/B/A (for Laser Via-Hole Processability Experiment)

The copper foils on both sides of the copper clad laminate B-2 manufactured in (5) were etched and removed, and then prepreg A-1 was placed and laminated on both sides thereof. MT18Ex copper foil (copper foil thickness of 2 μm/carrier thickness of 18 μm, manufactured by Mitsui) were placed and laminated on both sides thereof, and then the laminate was cured under the conditions of 220° C. and 35 kg/cm² for 120 minutes to manufacture a copper clad laminate A/B/A.

<Experimental Example: Measurement of Physical Properties of Thermosetting Resin Composition for Semiconductor Package, Prepreg and Copper Clad Laminate Obtained in Examples and Comparative Examples>

The physical properties of the thermosetting resin composition for semiconductor packages, prepregs and copper clad laminates obtained in the Examples and Comparative Examples were measured by the following methods, and the results are shown in Table 3.

1. Confirming the Occurrence of Prepreg Cracks

During the preparation of prepreg A-1, the resin composition (resin varnish) for a semiconductor package was impregnated into a glass fiber having a thickness of 15 μm (manufactured by Nittobo, NE-glass #1017), then dried with hot air at 130° C. for 2-5 minutes, and then cooled to room temperature. At this time, the occurrence of cracks on the surface of the prepreg was visually observed.

2. Relative Dielectric Constant (Dk @1 GHz) and Dielectric Dissipation Factor (Df @1 GHz)

After etching and removing the copper foils of the copper clad laminates (A-2, B-2) obtained in the Examples and Comparative Examples, the relative dielectric constant and dielectric dissipation factor were measured at 1 GHz using a relative dielectric constant measuring device (cavity resonator method). Specifically, the measurement was performed using a network analyzer (E5071C, Agilent Technologies) and SPDR
(Split Post Dielectric Resonator, QWED).

3. Adhesive Strength for Copper Foil (Peel Strength, P/S, kgf/cm)

In accordance with a test method of IPC-TM-650 2.4.8, the adhesive strength for copper foil of the copper clad laminates obtained in (6) and (7) of the Examples and Comparative Examples was measured.

4. Evaluation of Laser Via-Hole Processability

After removing only carriers on both sides of the copper clad laminate A/B/A(7) respectively manufactured in (8) of the Examples and Comparative Examples, via-holes having a diameter of 90 um were processed by a direct laser drill technique (ML605GTW4-5350U, Mitsubishi Electric) using a $CO_2$ laser.

* It was evaluated as X when delamination of copper foil occurred around the hole, and as O when there was no abnormality.

TABLE 1

Confirmation of the composition of the thermosetting resin composition for a semiconductor package of Examples and physical properties of the prepreg (unit: g)

| | Composition | | Ex. 1 | Ex. 2 | Ex. 3 | Ex. 4 |
|---|---|---|---|---|---|---|
| Modified phenylene ether oligomer/modified poly(phenylene ether) | a1 | OPE-2St-1200(Mn.1187) | 25 | — | 50 | 10 |
| | a2 | OPE-2St-2200(Mn.2250) | — | 60 | — | — |
| | a3 | SA-9000(Mn.2300) | — | — | — | 50 |
| | a4 | SA-90(Mn.1600) | — | — | — | — |
| Thermosetting resin | b1 | BMI-5100 | 20 | 20 | 20 | 20 |
| Elastic (co)polymer | c1 | Ricon181(Mn.3200) | — | — | 10 | 5 |
| | c2 | P1500 | — | 20 | 20 | 15 |
| | c3 | ULL-950S | 55 | — | — | — |
| | c4 | NZ-375 | — | — | — | — |
| | c5 | B-1000(Mn 1000) | — | — | — | — |
| | c6 | TAIC | — | — | — | — |
| Inorganic filler | d1 | SC2050HNJ | 75 | 75 | 75 | 75 |
| Alkoxy silane oligomer | e1 | Dynasylan6490 | 5 | 5 | 5 | 5 |
| Catalyst | | Co(acac)$_2$ | 0.035 | — | — | — |
| Evaluation result | Occurrence of prepreg cracks | Visual observation | Not occurred | Not occurred | Not occurred | Not occurred |
| | Dk | A | 3.22 | 3.1 | 3.13 | 3.09 |
| | | B | 3.46 | 3.34 | 3.37 | 3.32 |
| | Df | A | 0.0034 | 0.0022 | 0.0023 | 0.002 |
| | | B | 0.0032 | 0.002 | 0.0022 | 0.0019 |
| | Adhesive strength for copper foil (kgf/cm) | B | 0.63 | 0.71 | 0.65 | 0.67 |
| | | A/B/A | 0.55 | 0.75 | 0.55 | 0.61 |
| | Lase via-hole processability | Whether delamination of copper foil occurs | ○ | ○ | ○ | ○ |

TABLE 2

Confirmation of the composition of the thermosetting resin composition for a semiconductor package of Comparative Examples and physical properties of the prepreg (unit: g)

| | Composition | | Comp. Ex. 1 | Comp. Ex. 2 | Comp. Ex. 3 | Comp. Ex. 4 |
|---|---|---|---|---|---|---|
| Modified phenylene ether oligomer/modified poly(phenylene ether) | a1 | OPE-2St-1200(Mn.1187) | 60 | 50 | 25 | — |
| | a2 | OPE-2St-2200(Mn.2250) | — | — | — | — |
| | a3 | SA-9000(Mn.2300) | — | — | — | — |
| | a4 | SA-90(Mn.1600) | — | — | — | 50 |
| Thermosetting resin | b1 | BMI-5100 | 20 | 10 | 20 | — |
| Elastic (co)polymer | c1 | Ricon181(Mn.3200) | — | — | — | — |
| | c2 | P1500 | — | — | — | — |
| | c3 | ULL-950S | — | — | — | — |
| | c4 | NZ-375 | — | 30 | 55 | 30 |
| | c5 | B-1000(Mn 1000) | — | 10 | — | — |
| | c6 | TAIC | 20 | — | — | 20 |
| Inorganic filler | d1 | SC2050HNJ | 75 | 75 | 75 | 75 |
| Alkoxy silane oligomer | e1 | Dynasylan6490 | — | — | — | — |
| Catalyst | | Co(acac)$_2$ | — | 0.02 | 0.035 | 0.02 |
| Evaluation result | Whether to delamination of copper foil occurs | Appearance confirmation | Occurred | Occurred | Occurred | Occurred |
| | Dk | A | 3.11 | 3.14 | 3.23 | 3.16 |
| | | B | 3.35 | 3.37 | 3.42 | 3.38 |
| | Df | A | 0.0023 | 0.0029 | 0.0031 | 0.009 |
| | | B | 0.0021 | 0.0027 | 0.003 | 0.008 |
| | Adhesive strength for copper foil (kgf/cm) | B | 0.51 | 0.56 | 0.6 | 0.53 |
| | | A/B/A | 0.19 | 0.23 | 0.31 | 0.2 |
| | Lase via-hole processability | Occurrence of copper foil delamination | X | X | X | X |

*a1 OPE-2St-1200 (modified phenylene ether oligomer having vinylbenzyl groups at both ends, number average molecular weight of 1187 g/mol, vinyl group equivalent: 590 g/eq., manufactured by Mitsubishi Gas Chemical Company Inc.)
a2 OPE-2St-2200 (modified phenylene ether oligomer having vinylbenzyl groups at both ends, number average molecular weight of 2250 g/mol, vinyl group equivalent: 1189 g/eq., manufactured by Mitsubishi Gas Chemical Company Inc.)
a3 SA-9000 (modified phenylene ether oligomer having methacryl groups at both ends, number average molecular weight of 2300 g/mol, vinyl group functionality: 1.9, manufactured by Sabic Innovative Plastics)
a4 SA-90 (modified phenylene ether oligomer having hydroxy groups at both ends, number average molecular weight of 1600 g/mol, hydroxy group functionality: 1.9, manufactured by Sabic Innovative Plastics)
b1 BMI-5100 (bismaleimide, manufactured by Daiwa Kasei Industry Co. Ltd., CAS# 105391-33-1)
c1 Ricon181 (liquid SBR polymer, manufactured by Cray Valley, Tg-64° C., number average molecular weight of 3200 g/mol, styrene content of 28%)
c2 Tuftec P1500 (selectively hydrogenated Styrene-Butadiene block copolymer, manufactured by Asahi Kasei Corporation)
c3 ULL-950S (polybutadiene-containing cyanate ester, manufactured by Lonza)
c4 NZ-375 (dicyclopentadiene-containing cyanate ester, manufactured by Nanokor)
c5 B-1000 (polybutadiene liquid resin with 1,2-vinyl content of 85% or more, number average molecular weight of 900 to 1300 g/mol, manufactured by Nippon Soda Ltd.)
c6 TAIC (Triallyl Isocyanurate, manufactured by Tokyo Chemical Industry Co., Ltd., CAS#1025-15-6)
d1 SC2050HNJ (vinyl trimethoxysilane-treated slurry type micro silica, average particle size of 0.5 μm, manufactured by Admatechs)
e1 Dynasylan 6490 (methoxy-functional vinyl siloxane oligomer, manufactured by Evonik Degussa GmbH)

As shown in Table 1, it was confirmed that in the case of the prepregs or the metal clad laminates provided in the Examples, no cracks occurred during production of prepreg while having a low relative dielectric constant of 3.50 or less and a low dielectric dissipation factor of 0.0035 or less, and the adhesion strength for copper foil and laser via-hole processability were relatively excellent.

On the other hand, it was confirmed that in the case of the prepregs or the metal clad laminates provided in the Comparative Examples, cracks occurred during production of prepreg, or most of them exhibited low adhesion strength for copper foil, and during laser hole processing, delamination of copper foil occurred.

The invention claimed is:

1. A thermosetting resin composition comprising:
a modified phenylene ether oligomer or a modified poly(phenylene ether) having ethylenically unsaturated groups at both ends thereof;
a thermosetting resin comprising at least one resin selected from the group consisting of bismaleimide resin and bismaleimide-triazine resin, and at least one epoxy resin selected from the group consisting of bisphenol A type epoxy resin, phenol novolac epoxy resin, tetraphenyl ethane epoxy resin, naphthalene-based epoxy resin, biphenyl-based epoxy resin, dicyclopentadiene epoxy resin, and a mixture of dicyclopentadiene-based epoxy resin and naphthalene-based epoxy resin;
one or more elastic co-polymer or homo-polymer selected from the group consisting of a) a styrene-butadiene/butylene-styrene block co-polymer containing styrene in an amount of 10 to 70% by weight, and b) a cyanate ester containing polybutadiene rubber, polydimethylsiloxane or fluorinated thermoplastic resin in a molecule; and
an inorganic filler.

2. The thermosetting resin composition according to claim 1, wherein the modified phenylene ether oligomer or modified poly(phenylene ether) having ethylenically unsaturated groups at both ends thereof has a number average molecular weight of 1,000 to 3,000.

3. The thermosetting resin composition according to claim 1, wherein the ethylenically unsaturated group at both ends comprises ethenyl group, allyl group, methally group, propenyl group, butenyl group, hexenyl group, octenyl group, cyclopentenyl group, cyclohexenyl group, acryl group, methacryl group, vinylbenzyl group, or vinylnaphthyl group.

4. The thermosetting resin composition according to claim 1, comprising:
5 to 70 parts by weight of the modified phenylene ether oligomer or modified poly(phenylene ether) having ethylenically unsaturated groups at both ends thereof, 10 to 50 parts by weight of the thermosetting resin, and 5 to 70 parts by weight of the elastic co-polymer or homo-polymer, based on 100 parts by weight in total of the modified phenylene ether oligomer or modified poly(phenylene ether) having ethylenically unsaturated groups at both ends thereof, the thermosetting resin and the elastic (co)polymer or homo-polymer.

5. The thermosetting resin composition according to claim 1, wherein a content of the inorganic filler is 30 parts by weight to 200 parts by weight based on 100 parts by weight in total of the modified phenylene ether oligomer or modified poly(phenylene ether) having ethylenically unsaturated groups at both ends thereof, the thermosetting resin and the elastic co-polymer or homo-polymer.

6. The thermosetting resin composition according to claim 1, wherein the thermosetting resin composition further comprises an alkoxy silane oligomer.

7. The thermosetting resin composition according to claim 6, wherein the alkoxysilane oligomer comprises a repeating unit represented by the following Chemical Formula 1:

[Chemical Formula 1]

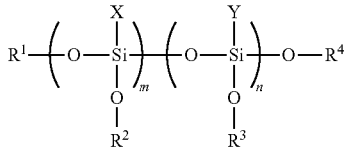

in Chemical Formula 1,
X and Y are each independently alkenyl, methacryl, acryl, phenyl, methyl, or epoxy,
R1 to R4 are each independently methyl or ethyl, and
m and n are each independently an integer of greater than 1.

8. The thermosetting resin composition according to claim 6, wherein the alkoxysilane oligomer is at least one compound selected from the group consisting of methoxy-functional vinyl siloxane oligomer, ethoxy-functional vinyl siloxane oligomer, and methoxy-functional vinyl/phenyl oligomer.

9. A prepreg comprising the thermosetting resin composition of claim 1 and an organic or inorganic fiber.

10. A metal clad laminate comprising the prepreg of claim 9 having a sheet shape; and a metal foil formed on at least one side of the prepreg.

11. The metal clad laminate comprising:
a first layer containing the thermosetting resin composition of claim 1 or a cured product thereof and an organic or inorganic fiber having a thickness of 15 μm to 90 μm;
a second layer formed on both surfaces of the first layer, and containing the thermosetting resin composition of claim 1 or a cured product thereof and an organic or inorganic fiber having a thickness of 10 μm to 30 μm; and
a metal thin film formed on an outer surface of each of the second layers.

12. The metal clad laminate of claim 11, wherein a thickness ratio of the second layer to the first layer is 0.2 to 0.7.

13. A metal clad laminate of claim 11, wherein a peel strength between the second layer and the metal thin film measured by the test method of IPC-TM-650 2.4.8 is 0.50 kgf/cm or more.

* * * * *